(12) United States Patent
Chi et al.

(10) Patent No.: US 10,090,058 B2
(45) Date of Patent: Oct. 2, 2018

(54) SEMICONDUCTOR DEVICE

(71) Applicant: SK hynix Inc., Icheon-si, Gyeonggi-do (KR)

(72) Inventors: Sung Soo Chi, Yongin-si (KR); Dong Woo Lyu, Yongin-si (KR); Jin Yo Park, Icheon-si (KR); Sang Kyung Shin, Seoul (KR); Kwang Soo Ahn, Icheon-si (KR); Sung Su Cha, Seongnamsi (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/450,453

(22) Filed: Mar. 6, 2017

(65) Prior Publication Data

US 2018/0082754 A1 Mar. 22, 2018

(30) Foreign Application Priority Data

Sep. 19, 2016 (KR) .......................... 10-2016-0119400

(51) Int. Cl.
*G11C 29/00* (2006.01)
*G11C 17/16* (2006.01)
*G11C 29/02* (2006.01)
*G11C 29/44* (2006.01)

(52) U.S. Cl.
CPC ............ *G11C 17/16* (2013.01); *G11C 29/027* (2013.01); *G11C 29/812* (2013.01); *G11C 2029/4402* (2013.01)

(58) Field of Classification Search
CPC ..... G11C 17/16; G11C 29/027; G11C 29/812; G11C 2229/763
See application file for complete search history.

(56) References Cited

U.S. PATENT DOCUMENTS

| | | | | |
|---|---|---|---|---|
| 6,269,030 | B1 * | 7/2001 | Hara | G11C 29/808 365/189.07 |
| 8,193,851 | B2 | 6/2012 | Kim | |
| 2004/0240249 | A1 * | 12/2004 | Kuzuno | G11C 29/02 365/145 |
| 2006/0056243 | A1 * | 3/2006 | Ayyapureddi | G11C 29/812 365/189.07 |
| 2007/0103999 | A1 * | 5/2007 | Kodama | G11C 29/02 365/200 |
| 2008/0072121 | A1 * | 3/2008 | Lee | G11C 29/806 714/768 |
| 2010/0295605 | A1 * | 11/2010 | Kim | G11C 17/16 327/525 |
| 2011/0128068 | A1 * | 6/2011 | Chi | G11C 29/785 327/525 |

(Continued)

*Primary Examiner* — Khamdan Alrobaie
(74) *Attorney, Agent, or Firm* — William Park & Associates Ltd.

(57) ABSTRACT

A semiconductor device may be provided. The semiconductor device may be configured for detecting a defect of a fuse set. The semiconductor device may include a pseudo initial signal generator configured to generate pseudo initial information on the basis of a test mode signal. The semiconductor device may include a fuse-set defect detector configured to compare fuse-set information of a fuse set or the pseudo initial information with a reference value on the basis of a fuse-set address, and detect a defect of the fuse set.

18 Claims, 10 Drawing Sheets

(56) References Cited

U.S. PATENT DOCUMENTS

| | | | |
|---|---|---|---|
| 2011/0235453 A1* | 9/2011 | Chi | G11C 17/16 365/225.7 |
| 2012/0188830 A1* | 7/2012 | Jeong | G11C 7/20 365/189.07 |
| 2014/0362654 A1* | 12/2014 | Lai | G11C 29/80 365/200 |
| 2015/0262709 A1* | 9/2015 | Anzou | G11C 29/4401 365/189.07 |

* cited by examiner

SEMICONDUCTOR DEVICE

CROSS-REFERENCE TO RELATED APPLICATION

This application claims priority based upon Korean patent application No. 10-2016-0119400, filed on Sep. 19, 2016, the disclosure of which is hereby incorporated in its entirety by reference herein.

BACKGROUND

1. Technical Field

Embodiments of the present disclosure may generally relate to a semiconductor device, and more particularly to a technology for detecting a defect of a fuse.

2. Related Art

In order to store an initial set value in a semiconductor device such as a dynamic random access memory (DRAM), one or more fuses may be used.

The fuses are classified into a metal fuse for storing information by cutting a metal using laser, an electrical fuse (E-fuse) for breaking down an oxide film by applying a high voltage to a transistor to store information therein, etc.

The E-fuse includes a transistor in the same manner as a general semiconductor device. The E-fuse may store information by applying a high voltage to the transistor without using an additional laser, such that the demand for E-fuses has recently increased.

The fuse may be configured in the form of a fuse array in which fuse cells are arranged in the form of a matrix. In order to store information in the fuse, a metal or oxide film is cut off only when an initial value of the fuse is changed.

The metal or oxide film need not be cut off in the initial state of the fuse. However, defective or faulty parts occur in a fabrication process, such that metal or oxide films of some fuse cells contained in the fuse array may be cut off. In this case, incorrect information may be stored in the fuse.

For example, although all the initial values of the fuse array must be set to zero "0", initial values of some fuse cells may be set to "1". In this case, when a user desires to store information "0" in a defective fuse cell, this means that each initial value is set to "0", such that the defective fuse cell is not cut off. As a result, since the defective fuse cell includes the value of "1" instead of the value of "0", incorrect information is unavoidably stored in the defective fuse cell.

Conventionally, if the presence of a defective fuse array is determined, the entire fuse array must be discarded. However, since only some parts of the fuse array generally have defective parts, discarding of the entire fuse array is cost ineffective and is far from efficient in terms of production efficiency.

SUMMARY

In accordance with an embodiment of the present disclosure, a semiconductor device may be provided. The semiconductor device may include a pseudo initial signal generator configured to generate pseudo initial information on the basis of a test mode signal. The semiconductor device may include a fuse-set defect detector configured to compare fuse-set information of a fuse set or the pseudo initial information with a reference value on the basis of a fuse-set address, and detect a defect of the fuse set.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

For convenience of description and better understanding of the present disclosure, an embodiment of the present disclosure may assume that a fuse array includes a plurality of fuse sets and each fuse set includes a plurality of fuse cells. Fuse cell information of 1 bit is stored in each fuse cell, and each fuse set stores as many pieces of fuse-set information as the number of bits corresponding to the number of fuse cells contained in the fuse set.

Various embodiments of the present disclosure may be directed to providing a semiconductor device that substantially obviates one or more problems due to limitations and disadvantages of the related art.

An embodiment of the present disclosure may relate to a semiconductor device configured to recognize the position of a defective fuse cell in a fuse array.

In the embodiments, the logic levels of the signals may be different from or the opposite of those described. For example, a signal described as having a logic "high" level may alternatively have a logic "low" level, and a signal described as having a logic "low" level may alternatively have a logic "high" level.

Figure 1:
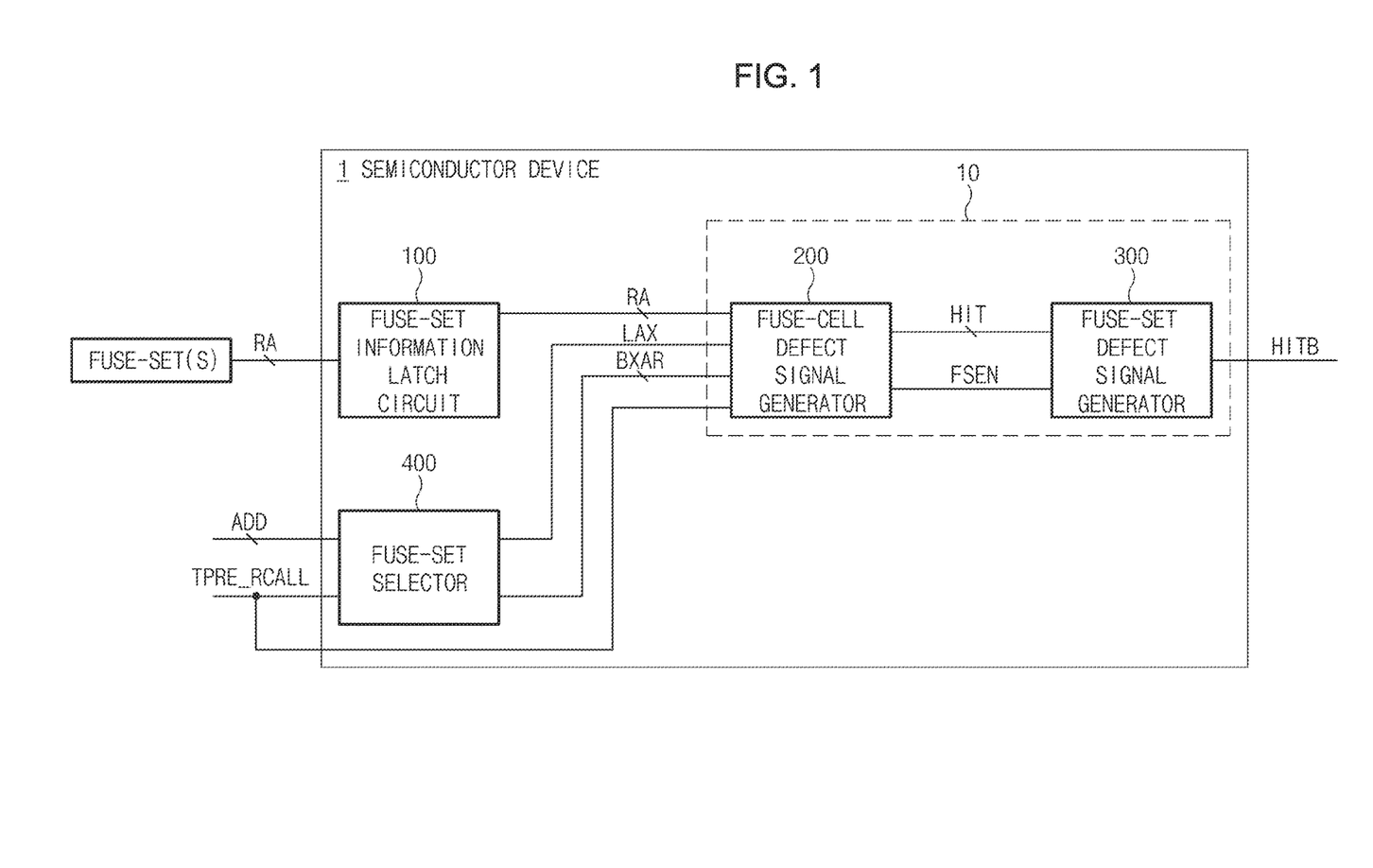
FIG. 1 is a block diagram illustrating a representation of an example of a semiconductor device according to an embodiment of the present disclosure.

FIG. 1 is a block diagram illustrating a representation of an example of a semiconductor device according to an embodiment of the present disclosure.

Referring to FIG. 1, the semiconductor device 1 according to an embodiment of the present disclosure may include a fuse-set information latch circuit 100, a fuse-set defect detector 10, and a fuse-set selector 400.

The fuse-set information latch circuit 100 may be coupled to each fuse set (i.e., fuse set(s)), and may latch fuse-set information RA. The fuse-set information RA may be latched by the fuse-set information latch circuit 100, and may be output to the fuse-set defect detector 10.

For example, each fuse set may include 12 fuse cells, and may store fuse-set information RA of 12 bits therein. If no defect occurs in an initial state of the fuse set, the fuse-set information RA may be, for example, "000000000000". The fuse-set information RA may be stored in or latched by the fuse-set information latch circuit 100, and may be output to the fuse-set defect detector 10. The fuse-set defect detector 10 may include a fuse-cell defect signal generator 200 and a fuse-set defect signal generator 300.

The fuse-cell defect signal generator 200 may compare either fuse-set information RA or pseudo initial information BXAR with a predetermined reference value, and may generate a fuse-cell defect signal HIT.

For example, the fuse-cell defect signal generator 200 may compare each bit (fuse-cell information) of the fuse-set information RA with a predetermined reference value when a fuse-set selection signal LAX is enabled. If the fuse-set defect signal generator 200 may compare pseudo initial information BXAR with the predetermined reference value when the fuse-set selection signal LAX is disabled.

In this case, if no defect occurs in the initial state of the fuse set, the reference value may be identical to fuse-cell information. For example, if no defect occurs in the initial state of the fuse set and the fuse-cell information is set to "0, the reference value may also be set to "0".

The pseudo initial information BXAR may be generated by the fuse-set selector 400 to be described later. The pseudo initial information BXAR may have the same number of bits as that of the fuse-set information RA. If no defect occurs in the initial state of the fuse set, the pseudo initial information BXAR may have the same value as that of the fuse-set information RA.

The fuse-cell defect signal generator 200 may generate a fuse-cell defect signal HIT according to the result of comparison. For example, the fuse-cell defect signal generator 200 may compare each bit of the fuse-set information RA or each bit of pseudo initial information BXAR having the same number of bits as that of the fuse-set information RA with a reference value, such that the fuse-cell defect signal generator 200 may generate the fuse-cell defect signal HIT having the same number of bits as that of the fuse-set information RA.

For example, if each bit (fuse-cell information) of the fuse-set information RA is identical to the reference value under the condition that the fuse-set selection signal LAX is enabled, the fuse-cell defect signal generator 200 may enable the fuse-cell defect signal HIT. If each bit (fuse-cell information) of the fuse-set information RA is different from the reference value under the condition that the fuse-set selection signal LAX is enabled, the fuse-cell defect signal generator 200 may disable the fuse-cell defect signal HIT. As described above, fuse-cell information obtained when no defect occurs in the initial state of the fuse set may be pre-allocated to the reference value. Accordingly, if no defect occurs in the initial state of the fuse set, each bit of the fuse-set information RA is identical to the reference value such that all the respective bits of the fuse-cell defect signal HIT may be enabled. However, if a defect occurs in the initial state of the fuse set, fuse-cell information may be different from the reference value. As a result, the fuse-cell defect signal HIT may be disabled.

If each bit of the pseudo initial information BXAR is identical to the reference value under the condition that the fuse-set selection signal LAX is disabled, the fuse-cell defect signal generator 200 may enable the fuse-cell defect signal HIT. If each bit of the pseudo initial information BXAR is different from the reference value under the condition that the fuse-set selection signal LAX is disabled, the fuse-cell defect signal generator 200 may disable the fuse-cell defect signal HIT. In this case, the pseudo initial information BXAR may be identical to fuse-set information RA obtained when no defect occurs in the initial state of the fuse set. The reference value may be identical to fuse-cell information obtained when no defect occurs in the initial state of the fuse set. Therefore, each of the pseudo initial information BXAR is identical to the reference value such that all the respective bits of the fuse-cell defect signal HIT may be enabled.

The fuse-cell defect signal generator 200 may also generate a fuse-set enable signal FSEN on the basis of a test mode signal TPRE_RCALL. A structure of the fuse-cell defect signal generator 200 will hereinafter be described with reference to FIGS. 2 and 3.

The fuse-set defect signal generator 300 may detect the presence or absence of a defective fuse set on the basis of the fuse-cell defect signal HIT.

For example, if any one of the fuse-cell defect signals HIT of several bits received from the fuse-cell defect signal generator 200 is disabled, the defective fuse set is determined so that the fuse-set defect signal HITB is enabled.

For example, if no defect occurs in the initial state of the fuse cell, all the bits of the fuse-cell defect signal HIT may be enabled to a logic high level. In this case, the fuse-set defect signal generator 300 may disable the fuse-set defect signal HITB to a logic low level.

If a defect occurs in the initial state of any one of fuse cells contained in the fuse set, at least one bit from among a plurality of bits of the fuse-cell defect signal HIT may be disabled to a logic low level. In this case, the fuse-set defect signal generator 300 may enable the fuse-set defect signal HITB to a logic high level.

In this way, the presence or absence of a defective fuse set may be determined according to whether the fuse-set defect signal HITB is enabled.

In the meantime, if the fuse-cell selection signal LAX is disabled, all the bits of the fuse-cell defect signal HIT are enabled, such that the fuse-set defect signal HITB may be disabled.

The fuse-set selector 400 may generate the fuse-set selection signal LAX and the pseudo initial information BXAR on the basis of a fuse-set address ADD and the test mode signal TPRE_RCALL.

For example, the fuse-set selector 400 may decode the fuse-set address ADD received from the external part, and may enable the fuse-set selection signal LAX for the fuse-set defect detector 10 corresponding to the fuse-set address ADD.

The fuse-set selector 400 may generate pseudo initial information BXAR on the basis of the test mode signal TPRE_RCALL. In this case, the pseudo initial information BXAR may have the same number of bits as that of the fuse-set information RA. If no defect occurs in the initial state of the fuse cell, each bit of the pseudo initial information BXAR may be generated to have the same level as that of the fuse-cell information.

For example, if no defect occurs in the initial state of the fuse cell and fuse-cell information has a low level value, each bit of the pseudo initial information BXAR may have a logic low level. Alternatively, fuse-cell information obtained when no defect occurs in the fuse cell may be set to a logic high level. In this case, each bit of the pseudo initial information BXAR may also be set to a logic high level.

Figure 2:
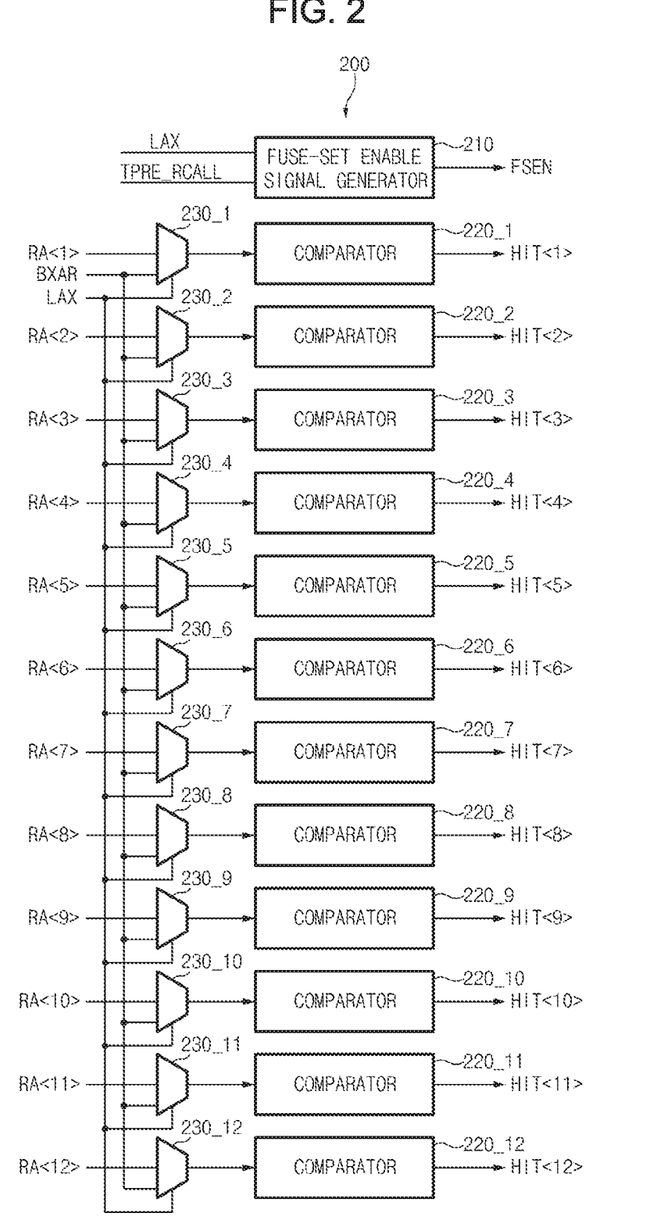
FIG. 2 is a circuit diagram illustrating a representation of an example of a fuse-cell defect detector illustrated in FIG. 1.

FIG. 2 is a circuit diagram illustrating a representation of an example of the fuse-cell defect signal generator 200 illustrated in FIG. 1.

Referring to FIG. 2, the fuse-cell defect signal generator 200 may include a fuse-set enable signal generator 210 and a plurality of comparators 220_1 to 220_12.

The fuse-set enable signal generator 210 may generate a fuse-set enable signal FSEN on the basis of the fuse-set selection signal LAX and the test mode signal TPRE_RCALL.

Figure 3:
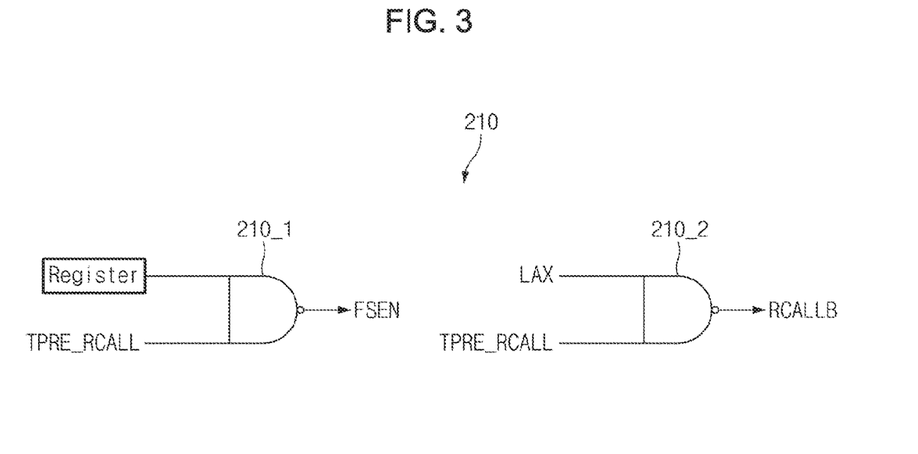
FIG. 3 is a circuit diagram illustrating a representation of an example of a fuse-set enable signal generator illustrated in FIG. 2.

FIG. 3 is a circuit diagram illustrating a representation of an example of the fuse-set enable signal generator 210 illustrated in FIG. 2.

Referring to FIG. 3, the fuse-set enable signal generator 210 may generate the fuse-set enable signal FSEN on the basis of the test mode signal TPRE_RCALL.

For example, if the test mode signal TPRE_RCALL is enabled to a logic high level, a rollcall signal RCALLB may be set to a logic low level irrespective of the value of the fuse selection signal LAX. A register of FIG. 3 may denote a predetermined reference value, and the reference value may have the same value as the fuse-cell information when no defect occurs in the initial state of the fuse set. For example, the reference value may be a logic low level, such that the fuse enable signal may be enabled to a logic high level.

That is, if the test mode signal TPRE_RCALL is enabled, the fuse-set enable signal generator 210 may enable the fuse set enable signal FSEN irrespective of the value of the fuse selection signal LAX.

In an embodiment, for example, the fuse-set enable signal generator 210 may be realized with for example but not limited to logic gates. For example, the logic gate 210_1 may perform a NAND logic operation on the predetermined reference value of the register and the test mode signal TPRE_RCALL and output the fuse set enable signal FSEN. For example, the logic gate 210_2 may perform a NAND logic operation on the fuse selection signal LAX and the test mode signal TPRE_RCALL and output a rollcall signal RCALLB. In an embodiment, for example, the logic gates 210_1 and 210_2 may include NAND gates.

Referring back to FIG. 2, any one of pseudo initial information BXAR and fuse-cell information RA<1> to RA<12> is selected and is then input to the comparators 220_1 to 220_12. For example, if the fuse-set selection signal LAX is enabled, the fuse cell information RA<1> to RA<12> may be selected. If the fuse-set selection signal LAX is disabled, the pseudo initial information BXAR is selected. In an embodiment, for example, data selectors 230_1 to 230_12 may be used to, respectively, select the fuse-cell information RA<1> to RA<12> or the pseudo initial information BXAR based on the fuse-set selection signal LAX, and then output the resultant signal to the respective comparators 220_1 to 220_12. In an embodiment, the data selectors 230_1 to 230_12 may include, for example but not limited to, multiplexers.

The comparators 220_1 to 220_12 may compare one value selected from among the pseudo initial information BXAR and fuse-cell information RA<1> to RA<12> with the reference value, and may generate fuse-cell defect signals HIT<1> to HIT<12> indicating whether the selected value is identical to the reference value. The number of the comparators 220_1 to 220_12 is identical to the number of pieces of fuse-cell information RA<1> to RA<12>, i.e., the number of bits of the fuse-set information RA. An embodiment may include, for example but not limited to, 12 comparators 220_1 to 220_12, may determine whether each piece of fuse cell information RA<1> to RA<12> with reference information BXAR, and may generate fuse-cell defect information HIT<1> to HIT<12> for each fuse cell.

Figure 4:
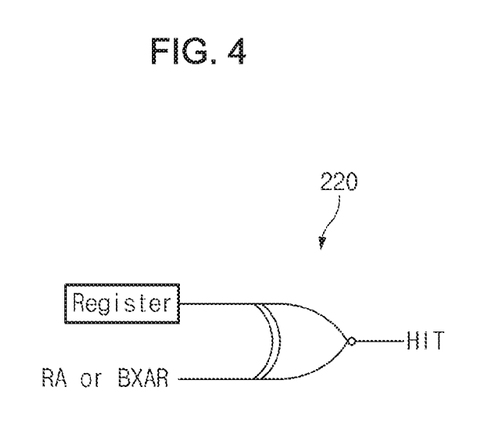
FIG. 4 is a circuit diagram illustrating a representation of an example of a comparator illustrated in FIG. 2.

FIG. 4 is a circuit diagram illustrating a representation of an example of the comparator 220 (including 220_1 to 220_12) illustrated in FIG. 2. In this case, the fuse-cell defect signal HIT may represent fuse-cell defect signals HIT<1> to HIT<12>.

Referring to FIG. 4, the comparator 220 may perform, for example, a NXOR logic operation and may be implemented with a logic circuit, for example but not limited to, an NXOR gate. The NXOR operation may be performed between one value selected from among the pseudo initial information BXAR and fuse-cell information RA<1> to RA<12> and the reference value (denoted by the register of FIG. 4).

For example, assuming that the fuse-cell information RA<1> to RA<12> is selected, if the fuse-cell information RA<1> to RA<12> is different from the reference value because a defect occurs in the initial state of the fuse cell, the fuse-cell defect signal HIT may be disabled to a logic low level. If no defect occurs in the initial state of the fuse cell, the fuse-cell information RA<1> to RA<12> is identical to the reference value, such that the fuse-cell defect signal HIT may be enabled to a logic high level.

However, if the pseudo initial signal BXAR is selected, the pseudo initial signal BXAR is identical to the reference value such that the fuse-cell defect signal HIT may be enabled to a logic high level.

Figure 5:
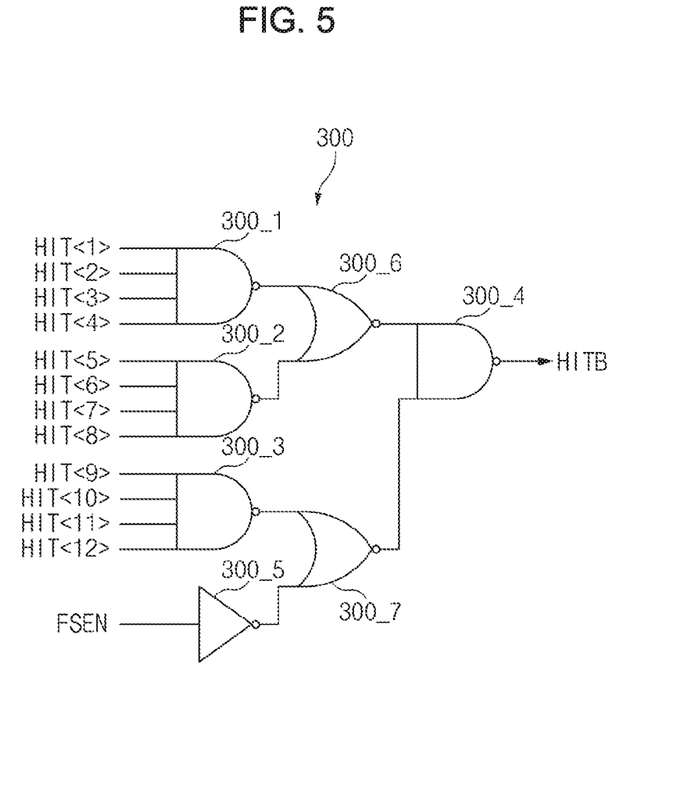
FIG. 5 is a circuit diagram illustrating a representation of an example of a fuse-set defect detector illustrated in FIG. 1.

FIG. 5 is a circuit diagram illustrating a representation of an example of the fuse-set defect signal generator 300 illustrated in FIG. 1.

Referring to FIG. 5, assuming that the fuse set enable signal FSEN and the fuse-cell defect signals HIT<1> to HIT<12> have the same level, the fuse-set defect signal generator 300 may disable the fuse-set defect signal. If there is a difference in level between the fuse set enable signal FSEN and the fuse-cell defect signals HIT<1> to HIT<12>, the fuse-set defect signal generator 300 may enable the fuse-set defect signal.

In this case, the fuse-set enable signal FSEN may be enabled when the test mode signal TPRE_RCALL is enabled. That is, if no defect occurs in the fuse cell, the fuse-set enable signal FSEN may have the same level as the fuse-cell defect signals HIT<1> to HIT<12>.

That is, assuming that the corresponding fuse set is selected, if at least one of fuse cells contained in the fuse set has a defect in the initial state thereof, the fuse-set defect signal generator 300 may enable the fuse-set defect signal HITB for the corresponding fuse set.

If the fuse set is not selected (if the fuse-set selection signal LAX is disabled), all the fuse-cell defect signals HIT<1> to HIT<12> may be enabled and the fuse-set enable signal FSEN may also be enabled. Therefore, the fuse-set defect signal generator 300 may disable the fuse-set defect signal HITB.

In an embodiment, the fuse-set defect signal detector 300 may include, for example but not limited to, logic gates 300_1 to 300_7. Logic gates 300_1 to 300_3 may perform NAND logic operations. For example, logic gate 300_1 may perform a NAND logic operation on fuse-cell defect signals HIT<1> to HIT<4> and output a resultant signal. Logic gate 300_2 may perform a NAND logic operation on fuse-cell defect signals HIT<5> to HIT<8> and output a resultant signal. Logic gate 300_6 may perform a NOR logic operation on the resultant signals of logic gates 300_1 and 300_2 and output a resultant signal. Logic gate 300_3 may perform a NAND logic operation on fuse-cell defect signals HIT<9> to HIT<12> and output a resultant signal. Logic gate 300_5 may perform an inversion operation on the fuse set enable signal FSEN and output a resultant signal. Logic gate 300_7 may perform a NOR logic operation on the resultant signals received from the logic gates 300_3 and 300_5 and output a resultant signal. Logic gate 300_4 may perform a NAND logic operation on the resultant signals received from logic gates 300_6 and 300_7 and output the fuse-set defect signal HITB. In an embodiment, for example, the logic gates 300_1 to 300_4 may include NAND gates, the logic gate 300_5 may include an inverter, and the logic gates 300_6 to 300_7 may include NOR gates.

Figure 6:
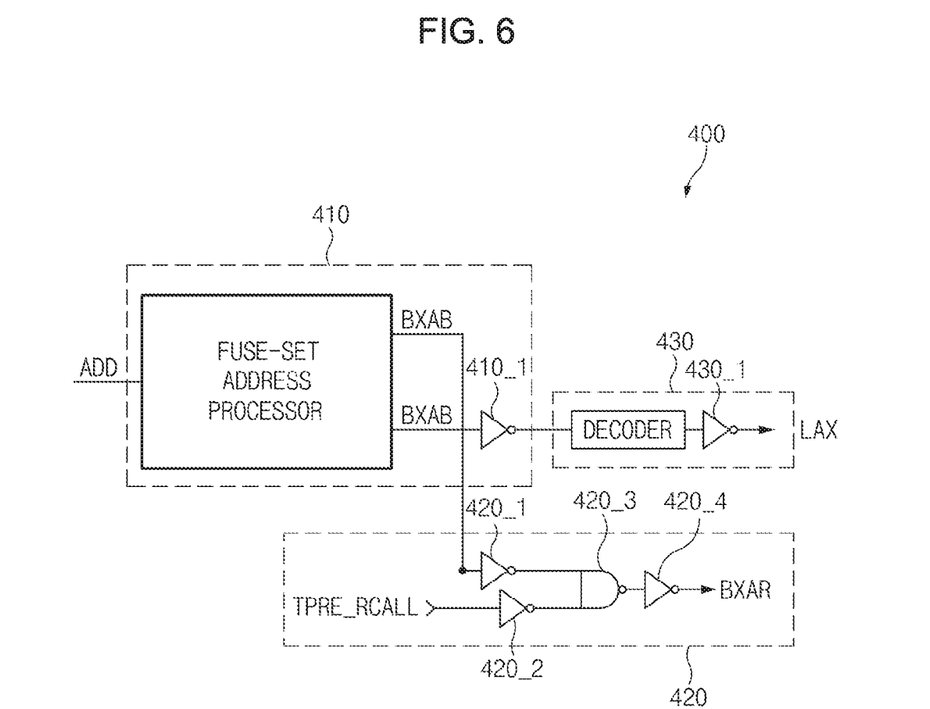
FIG. 6 is a circuit diagram illustrating a representation of an example of a fuse-set selector illustrated in FIG. 1.

FIG. 6 is a circuit diagram illustrating a representation of an example of the fuse-set selector 400 illustrated in FIG. 1.

Referring to FIG. 6, the fuse-set selector 400 may include a fuse-set address processor 410, a pseudo initial signal generator 420, and a fuse-set selection signal generator 430.

The fuse-set address processor 410 may generate a processing signal BXAB for processing the fuse-set address ADD to provide the processed result to the pseudo initial generator 420 and the fuse-set selection signal generator 430. In an embodiment, for example, a logic gate 410_1 may be used to perform an inversion logic operation on the processing signal BXAB before it is provided to the fuse-set selection signal generator 430. In an embodiment, the logic gate 410_1 may include, for example but not limited to, an inverter.

For example, the pseudo initial signal generator 420 may generate the pseudo initial information BXAR when the test mode signal TPRE_RCALL is enabled. The pseudo initial information BXAR may have the same number of bits as that of the fuse-set information RA. Each bit may have the same level as that of the fuse-cell information when no defect occurs in the initial state of the fuse set. The pseudo initial information BXAR and the fuse-cell information RA<1> to RA<12> may be selectively input to the comparator 220 of the fuse-cell defect signal generator 200.

The fuse-set selection signal generator 430 may decode the fuse-set address ADD, and may enable the fuse-set selection signal LAX when the fuse set corresponds to the fuse-set address ADD.

For example, the fuse-set selection signal generator 430 may decode an inversion signal of the processing signal BXAB generated from the fuse-set address processor 410, and may generate the fuse-set selection signal LAX.

In an embodiment, the pseudo initial signal generator 420 may include logic gates 420_1 to 420_4. For example, logic gate 420_1 may receive the processing signal BXAB from the fuse-set address processor 410 and perform an inversion logic operation on the processing signal BXAB and output a resultant signal. The logic gate 420_2 may receive the test mode signal TPRE_RCALL and perform an inversion logic operation on the test mode signal TPRE_RCALL and output a resultant signal. The logic gate 420_3 may perform a NAND logic operation on the resultant signal from logic gates 420_1 and 420_2 to output a resultant signal. The logic gate 420_4 may perform an inversion logic operation on the resultant signal of the logic gate 420_3 and output the pseudo initial information BXAR. The logic gates 420_1, 420_2, and 420_4 may include, for example but not limited to, inverters, and the logic gate 420_3 may include, for example but not limited to, a NAND gate. In an embodiment, the fuse-set selection signal generator 430 may include a decoder and logic gate 430_1. The decoder may be configured for receiving a resultant signal of the logic gate 410_1 and for outputting a resultant signal. The logic gate 430_1 may perform an inversion logic operation on the resultant signal of the decoder and output the fuse-set selection signal LAX.

An above-mentioned embodiment has disclosed that the semiconductor device 1 is coupled to only one fuse set for convenience of description. However, the scope or spirit of the present disclosure is not limited thereto, and it should be noted that the semiconductor device 1 may also be coupled to the plurality of fuse sets according to various other embodiments.

Figure 7:
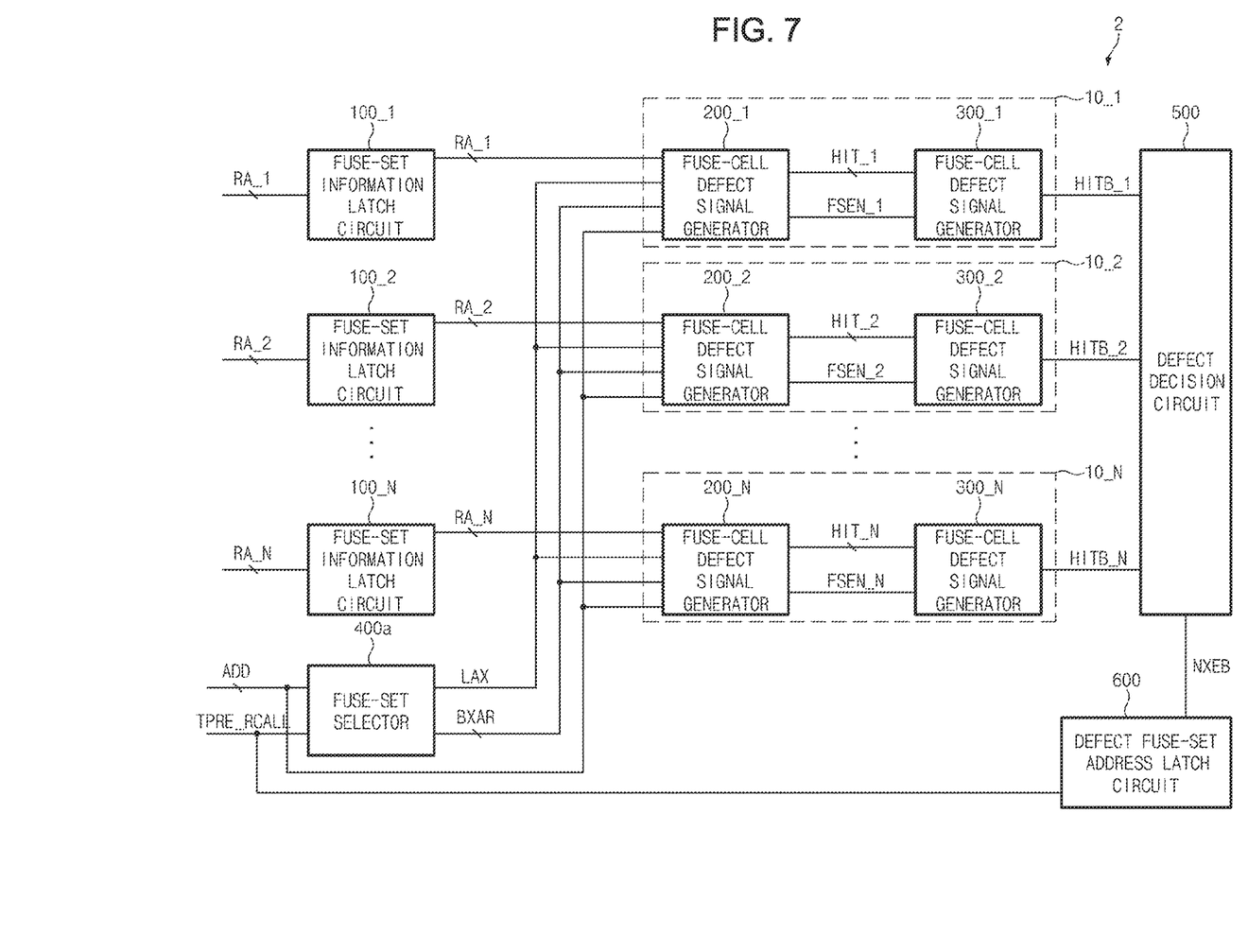
FIG. 7 is a block diagram illustrating a representation of an example of a semiconductor device according to an embodiment of the present disclosure.

FIG. 7 is a block diagram illustrating a representation of an example of a semiconductor device 2 according to an embodiment of the present disclosure.

Referring to FIG. 7, the semiconductor device 2 may include fuse-set information latch circuits 100_1 to 100_N corresponding to N fuse sets and fuse-set defect detectors 10_1 to 10_N corresponding to the N fuse sets, a fuse-set selector 400a, a defect decision circuit 500, and a defect fuse-set address latch circuit 600. In an embodiment, for example, N may be an integer greater than two.

For example, the fuse-set information latch circuit 100_1 and the fuse-set defect detector 10_1 may be coupled to the first fuse set, the fuse-set information latch circuit 100_2 and the fuse-set defect detector 10_2 may be coupled to the second fuse set, and the fuse-set information latch circuit 100_N and the fuse-set defect detector 10_N may be coupled to the N-th fuse set. Instead of the fuse set, the fuse-set information RA_1 to RA_N indicating initial state information of the respective fuse sets may be illustrated in FIG. 7.

The fuse-set selector 400a may be commonly coupled to the respective fuse sets (i.e., the fuse-set defect detectors 10_1 to 10_N).

The defect decision circuit 500 may be commonly coupled to the plurality of fuse-set defect detectors 10_1 to 10_N. Each of the fuse-set information latch circuits 100_1 to 100_N of the semiconductor device 2 may be identical to the fuse-set information latch circuit 100 of the semiconductor device 1. Each of the fuse-set defect detectors 101 to 10_N of the semiconductor device may be identical to the fuse-set defect detector 10 of the semiconductor device 1. That is, each of the fuse-cell defect signal generators 200_1 to 200_N of the semiconductor device 2 may be identical to the fuse-cell defect signal generator 200 of the semiconductor device 1, and each of the fuse-set defect signal generators 300_1~300_N of the semiconductor device 2 may be identical to the fuse-set defect signal generator 300 of the semiconductor device 1.

The fuse-set selector 400a may be substantially identical to the fuse-set selector 400 of the semiconductor device 1. However, the fuse-set selector 400 of the semiconductor device 1 may be coupled to a single fuse set. If the single fuse set corresponds to the fuse-set address ADD, the fuse-set selection signal LAX of 1 bit may be enabled or activated. However, the fuse-set selector 400a of the semiconductor device 2 may be coupled to the plurality of fuse sets. The fuse-set selector 400a may decode the fuse-set address ADD, and may enable the fuse-set selection signal LAX for only a specific fuse set corresponding to the fuse-set address ADD, and may disable the fuse-set selection signal LAX for the remaining fuse sets other than the specific fuse set. In other words, the fuse-set selection signal LAX generated by the fuse-set selector 400*a* of the semiconductor device 2 may have as many bits as the number of fuse sets, and any one bit from among the plurality of bits contained in the fuse-set selection signal LAX may be enabled according to the fuse set address ADD.

For example, assuming that 128 fuse sets are present, i.e., assuming that N of FIG. 7 is set to 128, the fuse-set address ADD composed of 7 bits may be input. In this case, if the fuse-set address "0000010" is input to the fuse-set selector 400*a*, the fuse-set selection signal LAX for only the second fuse set may be enabled, and the fuse-set selection signals LAX for the remaining 127 fuse sets other than the second fuse set may be disabled.

In addition, the fuse-set selector 400*a* may output the fuse selection signal LAX and the pseudo initial information BXAR on the basis of the test mode signal TPRE_RCALL and the fuse set address ADD in the same manner as in the fuse-set selector 400. However, the pseudo initial information BXAR of the semiconductor device 2 may be input to the plurality of fuse sets (i.e., the fuse-set defect detectors 10_1 to 10_N).

The defect decision circuit 500 may be additionally contained in the semiconductor device 2 according to an embodiment, and may generate a defect signal NXEB on the basis of the fuse-set defect signals HITB_1 to HITB_N.

For example, the defect decision circuit 500 may disable the defect signal NXEB when all the fuse-set defect signals HITB_1 to HITB_N are disabled. If at least one of the fuse-set defect signals HITB_1 to HITB_N is enabled, the defect decision circuit 500 may enable the defect signal NXEB. That is, the defect decision circuit 500 may determine whether there is a defect among the plurality of fuse sets (i.e., the fuse array).

The defect fuse-set address latch circuit 600 may store (latch) the fuse-set address ADD in response to the defect signal NXEB. By the above-mentioned structure, if a defect occurs in the initial state of the fuse array, the defect fuse-set address latch circuit 600 may recognize which fuse set has a defect.

The operations of the semiconductor device 2 having the above-mentioned constituent elements will hereinafter be described.

The fuse-set information RA_0 to RA_N may be respectively stored in the fuse-set latch circuits 100_1 to 100_N. In order to operate the semiconductor device 2, the test mode signal TPRE_RCALL may be enabled. The fuse-set address ADD of a desired fuse set from which a defect is to be detected may be input to the semiconductor device 2.

The fuse-set selector 400*a* may generate the pseudo initial information BXAR on the basis of the test mode signal TPRE_RCALL. The fuse-set selector 400*a* may decode the fuse-set address ADD, and may generate the fuse-set selection signal LAX composed of several bits. In this case, among the plurality of fuse sets, the fuse-set selection signal LAX for only one fuse set corresponding to the fuse-set address ADD may be enabled, and the fuse-set selection signals LAX for the remaining fuse sets may be disabled.

After one fuse-cell defect signal generator selected from among the fuse-cell defect signal generators 200_1 to 200_N receives the enabled fuse-set selection signal LAX, the selected fuse-cell defect signal generator may compare one fuse-set information (any one of RA_1 to RA_N) generated from the corresponding fuse-set information latch circuit (any one of 100_1 to 100_N) with a predetermined reference value, and may thus generate a single fuse-cell defect signal (any one of HIT_1 to HIT_N).

After each of the remaining (N−1) fuse-cell defect signal generators (i.e., (N−1) fuse-cell defect signal generators from among 200_1 to 200_N) receives the disabled fuse-set selection signal LAX, the remaining (N−1) fuse-cell defect signal generators may compare the pseudo initial information BXAR with a predetermined reference value, and may thus generate (N−1) fuse-cell defect signals (i.e., (N−1) fuse-cell defect signals from among HIT_1 to HIT_N). In this case, the pseudo initial information BXAR and the reference value may have the same value, such that all the (N−1) fuse-cell defect signals (i.e., (N−1) fuse-cell defect signals from among HIT_1 to HIT_N) may be enabled.

In addition, the fuse-cell defect signal generators 200_1 to 200_N may generate the fuse-set enable signals FSEN_to FSEN_N on the basis of the test mode signal TPRE_RCALL. Each of the fuse-set enable signals FSEN_1 to FSEN_N may indicate whether information is stored (or programmed) in the original fuse set. However, an embodiment may detect whether the fuse set has a defect in the initial state before information is stored in the fuse set. If the test mode signal TPRE_RCALL is enabled, the fuse-set enable signals FSEN_1 to FSEN_N may be enabled.

The fuse-set defect signal generators 300_1 to 300_N may respectively generate the fuse-set defect signals HITB_1 to HITB_N on the basis of the fuse-cell defect signals HIT_1 to HIT_N and the fuse-set enable signals FSEN_1 to FSEN_N.

For example, if at least one bit from among the plurality of fuse-cell defect signals HIT_1 to HIT_N each including a plurality of bits is disabled, the fuse-set defect signal generators 300_1 to 300_N may enable the fuse-set defect signals HITB_1 to HITB_N, respectively. In this case, all the fuse-cell defect signals HIT_1 to HIT_N generated by the (N−1) fuse-cell defect signal generators (i.e., (N−1) fuse-cell defect signal generators from among 200_1 to 200_N) in which the fuse-set selection signal LAX is disabled are enabled, such that the fuse-set defect signal generators (i.e., (N−1) fuse-set defect signal generators from among 300_1 to 300_N) corresponding to the (N−1) fuse-cell defect signal generators from among 200_1 to 200_N may disable the fuse-set defect signals (i.e., (N−1) fuse-set defect signals from among HITB_1~HITB_N. If a defect occurs in the initial state of the fuse cell, the single fuse-cell defect signal generator from among the fuse-cell defect signal generators 200_1 to 200_N in which the fuse-set selection signal LAX is enabled may disable at least one of the plurality of bits contained in each fuse-cell defect signal (one of the fuse-cell defect signals HIT_1 to HIT_N). Therefore, the corresponding fuse-set defect signal generator (i.e., one of the fuse-set defect signal generators 300_1 to 300_N) may enable one of the fuse-set defect signals HITB_1 to HITB_N. If no defect occurs in the initial state of the fuse cell, the single enabled fuse-cell defect signal generator (one of the fuse-cell defect signal generators 200_1 to 200_N) in which the fuse-set selection signal LAX is enabled may enable all the bits contained in one of the fuse-cell defect signals HIT_1 to HIT_N. Therefore, the corresponding fuse-set defect signals (one of the fuse-set defect signals HITB_1 to HITB_N) may be disabled.

The defect decision circuit 500 may determine the presence of a defect in the fuse array when at least one of the fuse sets has a defect.

For example, the defect decision circuit 500 may enable the defect signal NXEB when at least one of the fuse-set defect signals HITB_1 to HITB_N is disabled.

If the defect signal NXEB is enabled, the defect fuse-set address latch circuit 600 may store the fuse-set address ADD such that the fuse-set address ADD is no longer used in the future.

Figure 8:
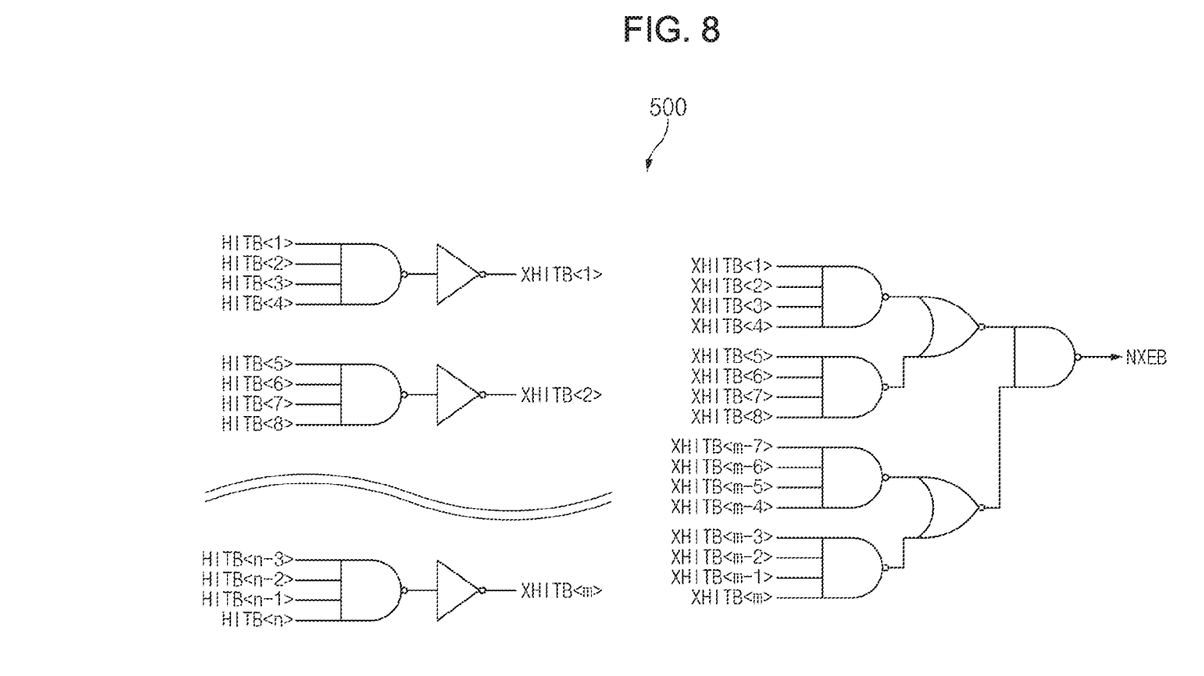
FIG. 8 is a circuit diagram illustrating a representation of an example of a defect decision circuit illustrated in FIG. 7.

FIG. 8 is a circuit diagram illustrating a representation of an example of the defect decision circuit 500 illustrated in FIG. 7.

Referring to FIG. 8, the defect decision circuit 500 may generate an intermediate signal XHITB on the basis of four fuse-set defect signals HITB. The defect decision circuit 500 may finally generate the defect signal NXEB on the basis of the result of a NAND operation among four intermediate signals XHITB. In an embodiment, for example, after performing the NAND operation with the four fuse-set defect signals (i.e., HITB<1:4>) a resultant signal may then be outputted. An inversion operation may then be performed on the resultant signals outputted from the NAND operations to output the respective intermediate signals (i.e., XHITB<1:m>). In an embodiment, for example, a NAND operation may be performed with the four intermediate signals (i.e., XHITB<1:4>) and a resultant signal may be outputted. In an embodiment, for example, a NAND operation may be performed with the four intermediate signals (i.e., XHITB<5:8>) and a resultant signal may be outputted. In an embodiment, for example, a NOR operation on two of the resultant signals from the NAND operations may then be performed and a resultant signal may be provided. In an embodiment, for example, a NAND operation on two of the resultant signals from the NOR operation may be made to provide the defect signal NXEB. The NAND operations may be performed by, for example but not limited to, NAND gates. The NOR operations may be performed by, for example but not limited to, NOR gates. The inversion operations may be performed by, for example but not limited to, inverters.

The defect decision circuit 500 in which four signals are tied up and then processed is implemented as illustrated in FIG. 8. However, the scope or spirit of the present disclosure is not limited thereto, and the defect signal NXEB may be enabled when at least one of the fuse-set defect signals HITB_1 to HITB_N is enabled. In FIG. 8 m may be an integer greater than eight.

Figure 9:
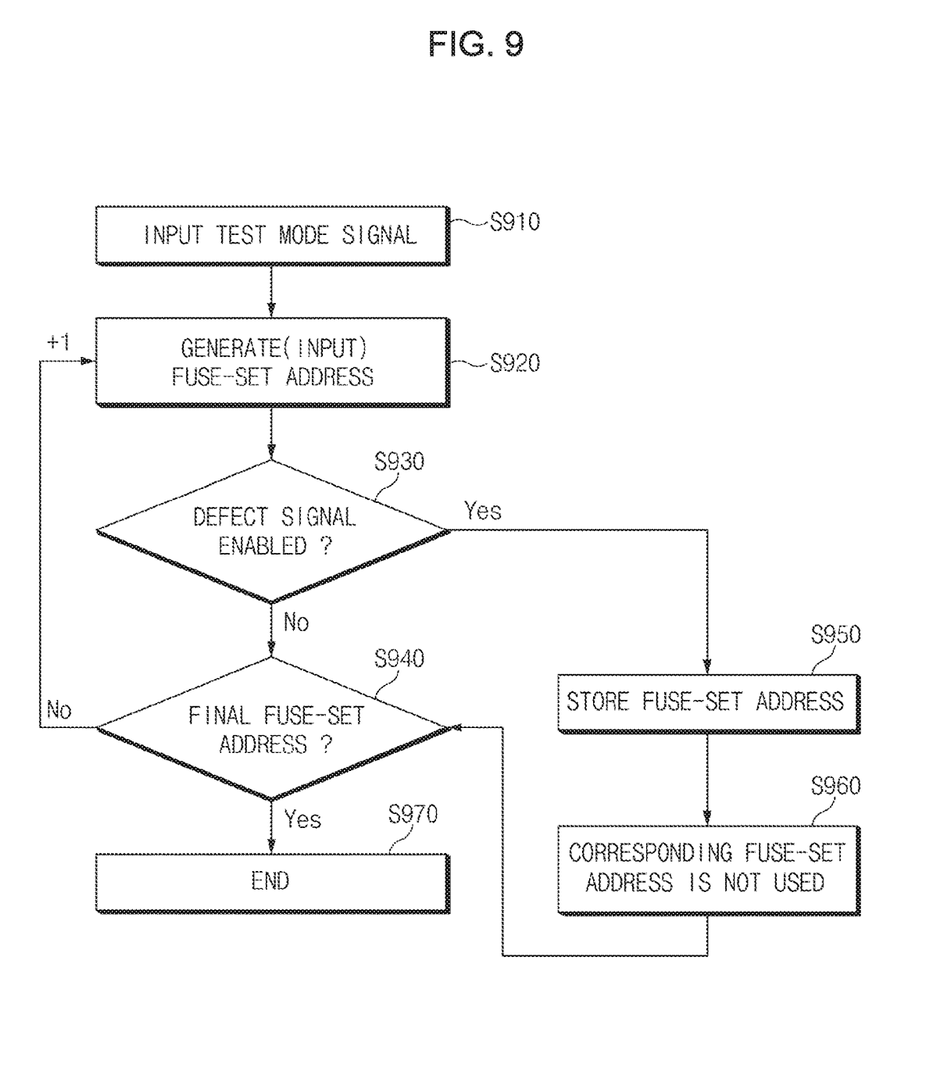
FIG. 9 is a flowchart illustrating a method for processing information in the semiconductor device illustrated in FIG. 7.

FIG. 9 is a flowchart illustrating a method for processing information in the semiconductor device 2 illustrated in FIG. 7.

Referring to FIG. 9, the test mode signal TPRE_RCALL may be enabled to operate the semiconductor device 2 in step S910.

If the test mode signal TPRE_RCALL is enabled, the fuse-set selector 400a may generate the fuse-set address ADD in step S920. Although the above-mentioned embodiments have disclosed that a specific fuse-set address ADD is received from the external part, the scope or spirit of the present disclosure is not limited thereto, and the sequentially increasing fuse-set address ADD may be generated in the embodiments of the present disclosure.

Thereafter, it is determined whether the defect signal NXEB is enabled in the specific fuse-set address ADD in step S930.

If the defect signal NXEB is enabled in step S930, this means that a defect occurs in the fuse set corresponding to a current fuse-set address ADD, such that the current fuse-set address ADD is stored in step S950.

Information is not programmed in the fuse set corresponding to the current fuse-set address ADD in step S960.

If the current fuse set is not identical to the final fuse set in step S940, the fuse-set address ADD may increase in step S970. In this way, the fuse-set address ADD is sequentially increased and at the same time information indicating whether the defect signal NXEB is enabled is recognized. If the defect signal NXEB is enabled in step S930, the current fuse-set address ADD is latched in step S950, and the fuse set corresponding to the subsequently-latched fuse-set address ADD is no longer used in step S960. If the defect signal NXEB is disabled, the fuse-set address ADD may be sequentially increased until the final fuse set is reached.

By the above-mentioned structure, an embodiment may test which one of fuse sets contained in the fuse array has an initial defect. Therefore, the remaining fuse sets other than the defective fuse set are used such that the fuse array may be efficiently used.

As is apparent from the above description, the semiconductor devices according to the embodiments of the present disclosure may recognize the position of a defective fuse cell from which a defect or faulty part occurs in an initial state. Therefore, the remaining fuse cells other than the defective cells can be used such that the fuse array can be efficiently used.

The semiconductor devices and or methods as discussed above (see FIGS. 1-9) are particular useful in the design of other memory devices, processors, and computer systems. For example, referring to FIG. 10, a block diagram of a system employing a semiconductor device and or method in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 10:
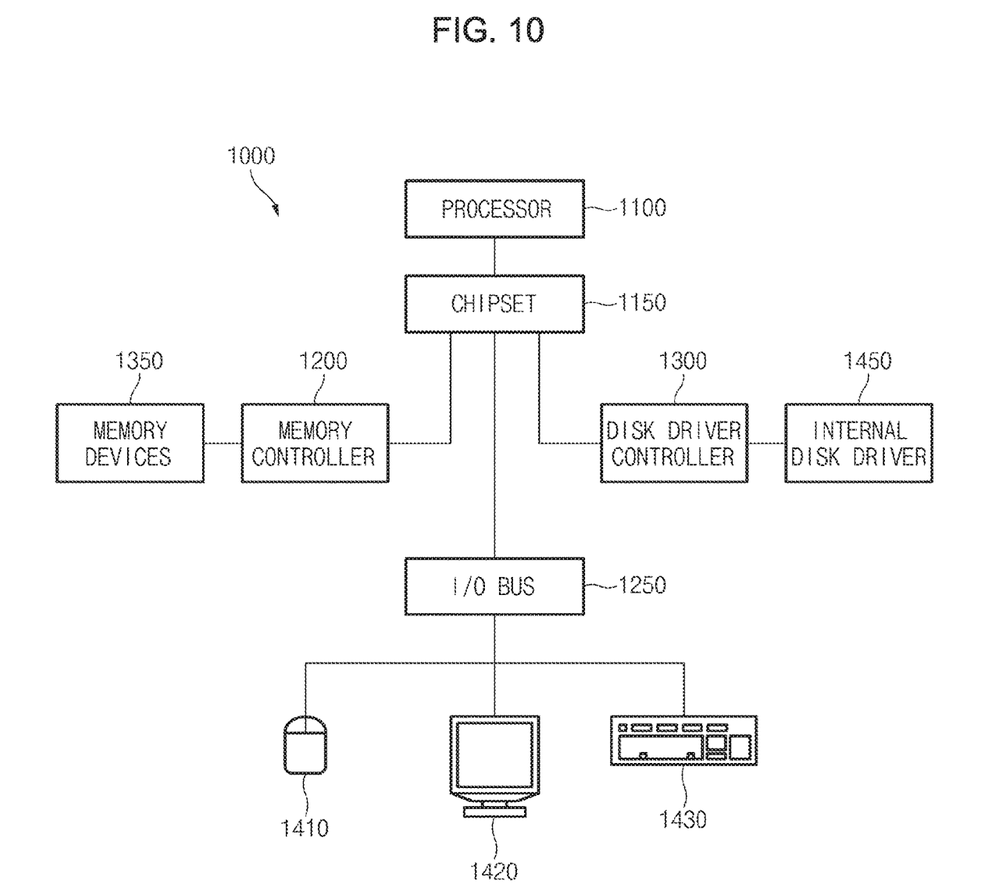
FIG. 10 illustrates a block diagram of an example of a representation of a system employing a semiconductor device or method with the various embodiments discussed above with relation to FIGS. 1-9.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and or employ the method as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor device and or employ the method as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 10 is merely one example of a system including a semiconductor device and or employing the method as discussed above with relation to FIGS. 1-9. In alternate embodiments, such as, for example but not limited to, cellular phones or digital cameras, the components may differ from the embodiments illustrated in FIG. 10.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a pseudo initial signal generator configured to generate pseudo initial information based on a test mode signal; and
   a fuse-set defect detector configured to compare one selected from fuse-set initial information indicating an initial state of a fuse set and the pseudo initial information based on a fuse-set address with a reference value thereby detecting an initial defect of the fuse set,
   wherein the reference value and the pseudo initial information correspond to a fuse-cell initial information in case the fuse set has no defect in the initial state.

2. The semiconductor device according to claim 1, wherein:
   if the fuse-set address indicates the fuse set, the fuse-set defect detector compares the fuse-set initial information with the reference value; and
   if the fuse-set address does not indicate the fuse set, the fuse-set defect detector compares the pseudo initial information with the reference value.

3. The semiconductor device according to claim 2, further comprising:
   a fuse-set address processor configured to process the fuse-set address and provide the processed result as a processing signal;
   a fuse-set selection signal generator configured to decode the fuse-set address based on the processing signal and generate a fuse-set selection signal,
   wherein, if the fuse-set selection signal is enabled, the fuse-set defect detector compares fuse-cell information of the fuse-set initial information with the reference value; and if the fuse-set selection signal is disabled, the fuse-set defect detector compares the pseudo initial information with the reference value.

4. The semiconductor device according to claim 1, wherein:
   the fuse-set initial information includes a plurality of bits; and
   the pseudo initial information has the same number of bits as that of the fuse-set initial data.

5. The semiconductor device according to claim 4, wherein the fuse-set defect detector includes:
   a fuse-cell defect signal generator configured to compare each bit of the fuse-set initial information or each bit of the pseudo initial information with the reference value, and generate a fuse-cell defect signal composed of several bits; and
   a fuse-set defect signal generator configured to generate a fuse-set defect signal on the basis of the fuse-cell defect signal composed of the several bits.

6. The semiconductor device according to claim 5, wherein the fuse-cell defect signal generator further comprises:
   a fuse-set enable signal generator configured to generate a fuse-set enable signal on the basis of the test mode signal.

7. The semiconductor device according to claim 6, wherein the fuse-set defect signal generator is configured to generate the fuse-set defect signal on the basis of the fuse-cell defect signal composed of the several bits and the fuse-set enable signal.

8. The semiconductor device according to claim 1, further comprising:
   a fuse-set information latch circuit configured to store the fuse-set initial information.

9. A semiconductor device comprising:
   a pseudo initial signal generator configured to generate pseudo initial information based on a test mode signal;
   a fuse-set selection signal generator configured to generate a fuse-set selection signal composed of several bits on the basis of a fuse-set address;
   a first fuse-set defect detector configured to select any one of first fuse-set initial information indicating an initial state of a first fuse set and the pseudo initial information as first data on the basis of a bit value of the fuse-set selection signal corresponding to the first fuse set, compare the first data with a reference value, and detect a defect of the first fuse set; and a second fuse-set defect detector configured to select any one of second fuse-set initial information indicating an initial state of a second fuse set and the pseudo initial information as second data on the basis of a bit value of the fuse-set selection signal corresponding to the second fuse set, compare the second data with a reference value, and detect a defect of the second fuse set.

10. The semiconductor device according to claim 9, wherein:

each of the first fuse-set initial information, the second fuse-set initial information, and the pseudo initial information includes a plurality of bits; and the first fuse-set initial information, the second fuse-set initial information, and the pseudo initial information includes the same number of bits;

the first fuse-set defect detector includes:

a first fuse-cell defect signal generator configured to compare each bit of the first fuse-set initial information or each bit of the pseudo initial information with the reference value, and generate a first fuse-cell defect signal composed of several bits; and a first fuse-set defect signal generator configured to generate a first fuse-set defect signal on the basis of a first fuse-cell defect signal composed of the several bits, the second fuse-set defect detector includes:

a second fuse-cell defect signal generator configured to compare each bit of the second fuse-set initial information or each bit of the pseudo initial information with the reference value, and generate a second fuse-cell defect signal composed of several bits; and a second fuse-set defect signal generator configured to generate a second fuse-set defect signal on the basis of a second fuse-cell defect signal composed of the several bits.

11. The semiconductor device according to claim 10, wherein:

the first fuse-cell defect signal generator enables the first fuse-cell defect signal based on at least one of the first fuse-cell defect signals, each including a plurality of bits, being enabled; and the second fuse-cell defect signal generator enables the second fuse-cell defect signal based on at least one of the second fuse-cell defect signals, each including a plurality of bits, being enabled.

12. The semiconductor device according to claim 10, further comprising:

the defect decision circuit configured to generate a defect signal on the basis of the first fuse-set defect signal and the second fuse-set defect signal.

13. The semiconductor device according to claim 12, wherein the defect decision circuit enables the defect signal based on at least one of the first fuse-set defect signal and the second fuse-set defect signal being enabled.

14. The semiconductor device according to claim 12, further comprising:

a defect fuse-set address latch circuit configured to store the fuse-set address based on the defect signal.

15. The semiconductor device according to claim 10, wherein each of the first and second fuse-cell defect signal generators further comprises:

a fuse-set enable signal generator configured to generate a fuse-set enable signal based on the test mode signal, wherein the first fuse-set defect signal generator generates the first fuse-set defect signal on the basis of the first fuse-cell defect signal composed of the several bits and the fuse-set enable signal, and wherein the second fuse-set defect signal generator generates the second fuse-set defect signal on the basis of the second fuse-cell defect signal composed of the several bits and the fuse-set enable signal.

16. The semiconductor device according to claim 9, further comprising:

a fuse-set address processor configured to process the fuse-set address and provide the processed result as a processing signal, wherein the fuse-set selection signal generator decodes the fuse-set address based on the processing signal, wherein the fuse-set address is received by the fuse-set address processor externally from the semiconductor device or internally generates the fuse-set address, and wherein the fuse-set address increases sequentially.

17. The semiconductor device according to claim 9, further comprising:

a first fuse-set information latch circuit configured to store the first fuse-set initial information; and a second fuse-set information latch circuit configured to store the second fuse-set initial information.

18. A semiconductor device comprising:

a pseudo initial signal generator configured to generate pseudo initial information based on a test mode signal;

a fuse-set selection signal generator configured to generate a fuse-set selection signal composed of a plurality of bits on the basis of a fuse-set address; and a plurality of fuse-set defect detectors:

respectively corresponding to the plurality of bits of the fuse-set selection signal, respectively corresponding to a plurality of fuse-set initial information each indicating an initial state of a corresponding fuse set, and configured to select any one of a corresponding fuse-set initial information and the pseudo initial information based on a corresponding bit value of the fuse-set selection signal, compare the selected one with a reference value, thereby detecting a defect of the corresponding fuse set, wherein the reference value and the pseudo initial information correspond to a fuse-cell initial information in case the fuse set has no defect in the initial state.

* * * * *